United States Patent [19]

Manning

[11] 3,735,017

[45] May 22, 1973

[54] LEAD FRAMES AND METHOD OF MAKING SAME

[75] Inventor: Randy Marshall Manning, Harrisburg, Pa.

[73] Assignee: AMP Incorporated, Harrisburg, Pa.

[22] Filed: Apr. 12, 1971

[21] Appl. No.: 133,065

[52] U.S. Cl.................174/52 S, 29/630 A, 29/576 S, 113/119, 174/DIG. 3

[51] Int. Cl. ..............................................H01r 9/00

[58] Field of Search.....................113/119; 29/630 A, 29/630 B, 576 S, 193.5; 317/234 N; 174/DIG. 3, 52 S

[56] References Cited

UNITED STATES PATENTS

| | | | |
|---|---|---|---|
| 3,597,666 | 8/1971 | Taskovich | 317/234 N |
| 2,476,429 | 7/1949 | Paules | 113/119 |
| 3,569,797 | 3/1971 | Simmons | 317/234 N |
| 3,628,483 | 12/1971 | Pauza | 174/DIG. 3 |

*Primary Examiner*—Richard J. Herbst
*Attorney*—William J. Keating, Ronald D. Grefe, Gerald K. Kita, Frederick W. Raring and Jay L. Seitchik

[57] ABSTRACT

The disclosure relates to a lead frame having a platelike heat sink portion and three leads, one of which is integral with the heat sink, are manufactured by blanking heat sink and leads, bending the integral lead relative to the heat sink, forming ends of the remaining leads, and again bending integral leads so that leads are in a plane which is parallel to, and spaced from, the heat sink.

5 Claims, 6 Drawing Figures

LEAD FRAMES AND METHOD OF MAKING SAME

This invention relates to transistor lead frames and, more particularly to one piece lead frames formed on a continuous strip.

A common type of transistor lead frame comprises a relatively massive heat sink, on which the transistor or chip is mounted, and three leads which are disposed in a plane extending parallel to, and spaced from the heat sink. The center lead is connected to the heat sink and the end leads have their end portions extending over the surface of the heat sink and are reversely bent towards each other so that their tips lie between the two planes. The transistor is disposed beneath the tip portions of the outside leads and these tips are bonded to the contact portions of the chip, the center lead serving as a collector for the transistor.

Lead frames of the type described above require leads of relatively thin stock metal. They also require a relatively thick heat sink to provide the required heat dissipation ability. Because of this fact, and because of the relative complexity of this type of lead frame, it has been customary in the past to manufacture such lead frames from two separate strips which are subsequently assembled to each other. The heat sinks are manufactured by stamping a relatively thick metal strip and the leads are manufactured by stamping and forming a relatively thin strip. The collector lead, in accordance with prior art practice, may then be assembled to the heat sink by a clinching or other mechanical fastening operation.

The prior art was improved as described in the application of Frederick J. Heinlen, Ser. No. 70,034, filed Sept. 8, 1970 wherein there is disclosed a one-piece transistor lead frame having a relatively thin plate-like heat sink section and three leads which are intricately formed in spaced relationship to the heat sink.

However, the lead frame of this application required extremely difficult bends in the formation thereof, thereby requiring complex production steps. The lead frame of said copending application also was more subject to breakage in the region of complex bending.

In accordance with the present invention, a one-piece lead frame is provided wherein the bending steps are less severe than those of the prior art, thereby permitting the use of less costly production techniques and providing a more reliable lead frame.

It is accordingly an object of the invention to provide an improved method for manufacturing transistor lead frames.

It is a further object of this invention to provide a method for manufacturing lead frames having a heat sink and having intricately formed leads in the form of a continuous strip.

It is a yet further object of this invention to provide a lead frame requiring minimal and simple bends.

These and other objects of the invention are achieved in a preferred embodiment thereof which is briefly described in the foregoing abstract, which is described in detail below and which is illustrated in the accompanying drawings in which.

Figure 6:
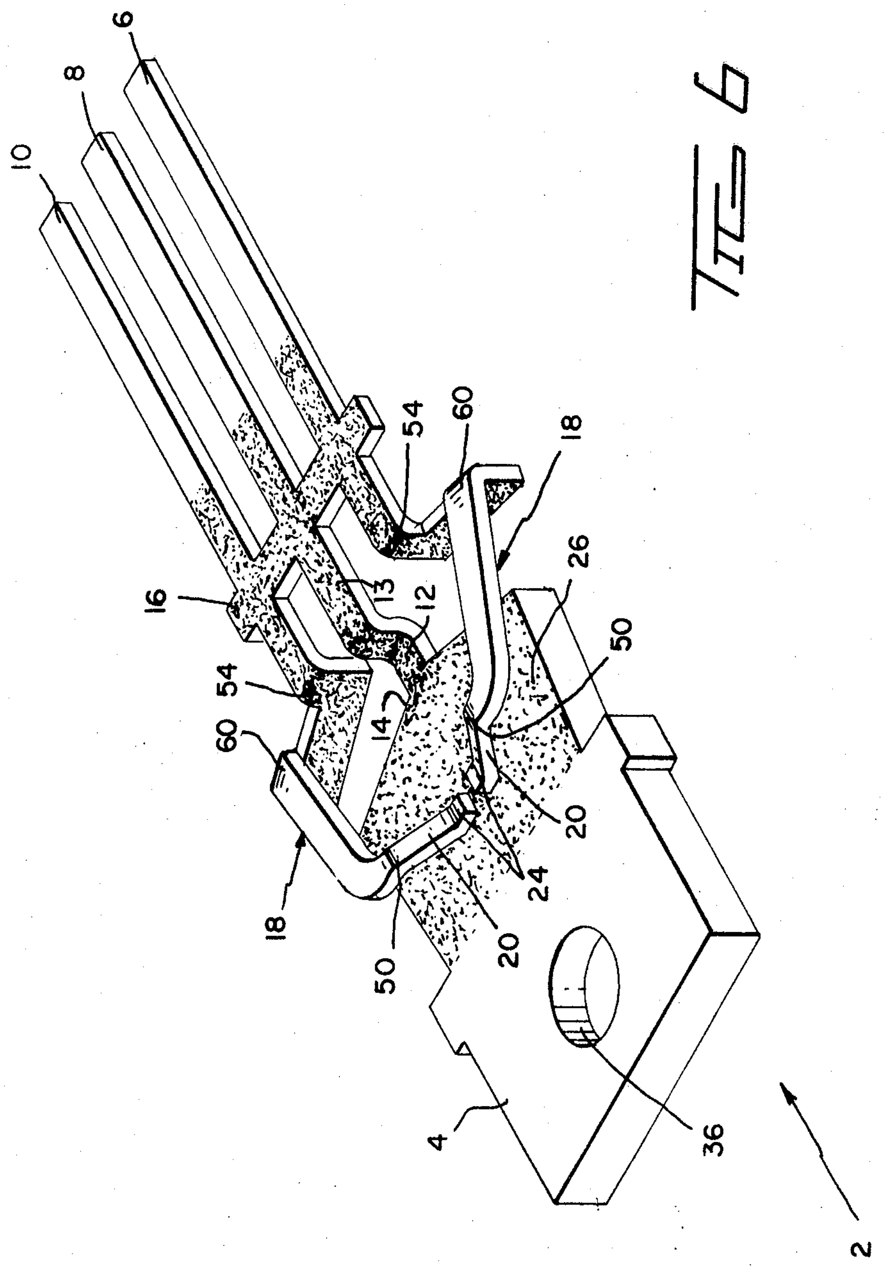
FIG. 6 is a perspective view of the portion of the strip of FIG. 1 after the sixth bending operation thereon.

Referring first to FIG. 6, there is shown a typical transistor lead frame 2 of the type adapted to be produced in accordance with the method of the present invention which comprises a relatively thick and massive metallic heat sink 4 having three leads 6, 8, 10 associated therewith. These leads are disposed in a plane which extends parallel to, and is spaced from, the plane of the heat sink 4, the center lead 8 being bent downwardly at its inner end 13 and including a connecting strap portion 12 which is integral with one edge 14 of heat sink 4. The outside leads 6, 10 are bent downwardly and have end portions 18 which extend over the upper surface of the heat sink 4 and past the edge 14. These outside leads have contact arms 20 on their ends which extend laterally in opposite directions and which are reversely bent downwardly towards the heat sink and inwardly towards each other so that the tips 24 of these arms are disposed in front of the connecting strap 12 and immediately above the surface of the heat sink. It should be noted at this point that these arm tips 24 are spaced apart by a distance which is substantially less than the width of the connecting strip 12 of center lead 8. This spacing is relatively critical for the reason that the tips of these contact arms will be bonded to the contact areas of the chip which is mounted on the heat sink. The outer arms 6, 10 are not directly connected to the heat sink 4 but are integral with the center lead 8 by virtue of the presence of a transversely extending tie bar 16.

When a transistor is assembled to the frame 2, the transistor or chip is placed on the upper surface of heat sink 4 with the tip portions 24 of the contact arms disposed against the contact areas of the chip. The chip has a thickness which is somewhat greater than the spacing between the ends 24 of the arms and the surface of the heat sink so that the chip is resiliently held in position while the frame is passed through a furnace in which solder metal 26 on the surface of the heat sink is reflowed to secure the chip to the frame. Thereafter, the ends of the leads, the chip, and portions of the heat sink are encapsulated by a molding process, the tie bar 16 functioning as a mold closure or dam bar during molding. The portions of the tie bar which extend between the leads are then removed by a stamping operation so that they are electrically separated from each other.

Figure 1:
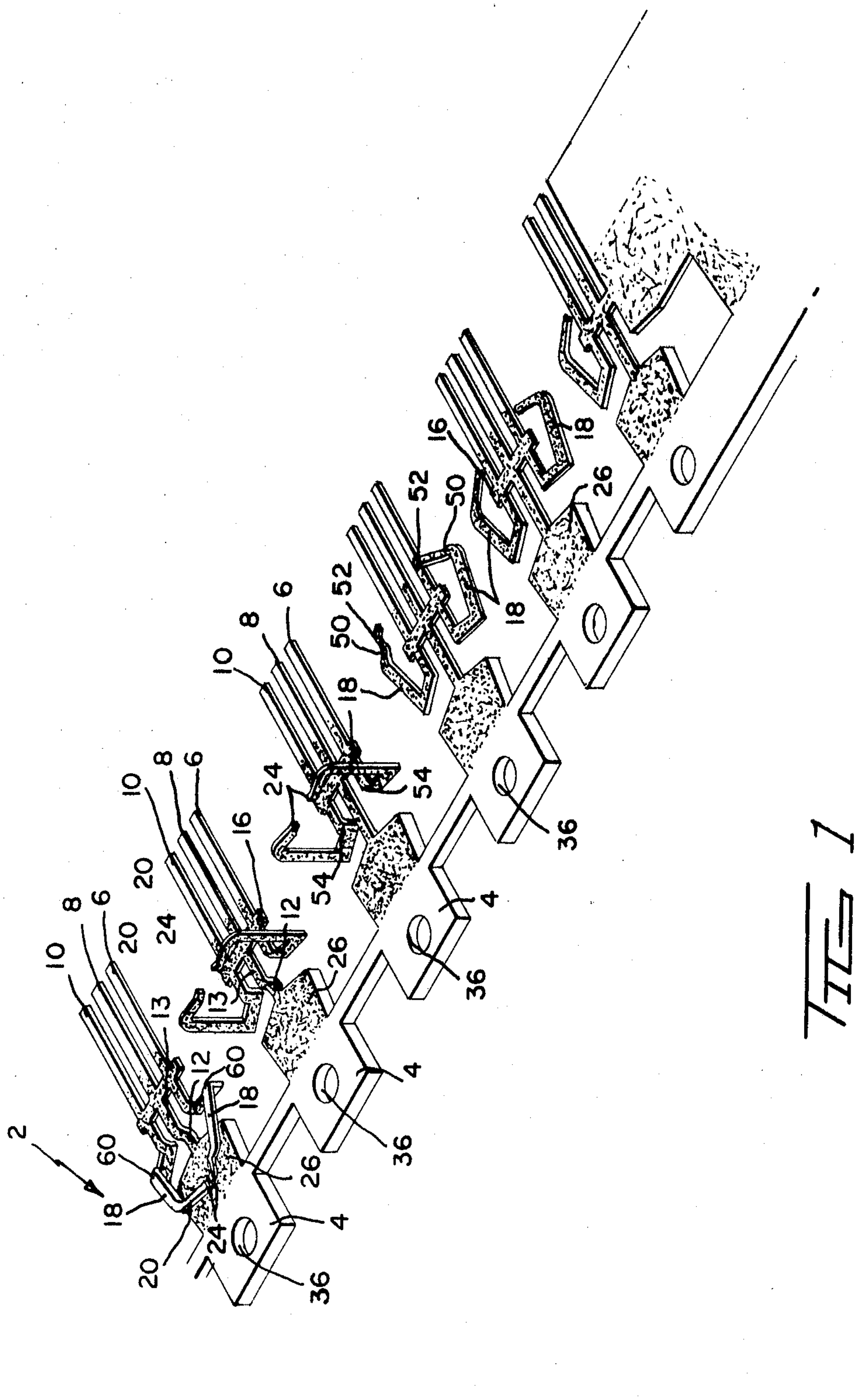
FIG. 1 is a plan view of a strip progression produced by successive bending operations in the formation of lead frames in accordance with the present invention.

Turning now to FIG. 1 the method aspect of the invention is illustrated by the progression which shows the successive stamping and forming steps performed on strip metal to produce the finished lead frame. Stock metal of this type may be produced by rolling or by milling metal strip having a uniform thickness. Frames in accordance with the invention are conventionally produced from copper alloy stock which has been plated with nickel although other metals may be used.

Figures 2, 3:
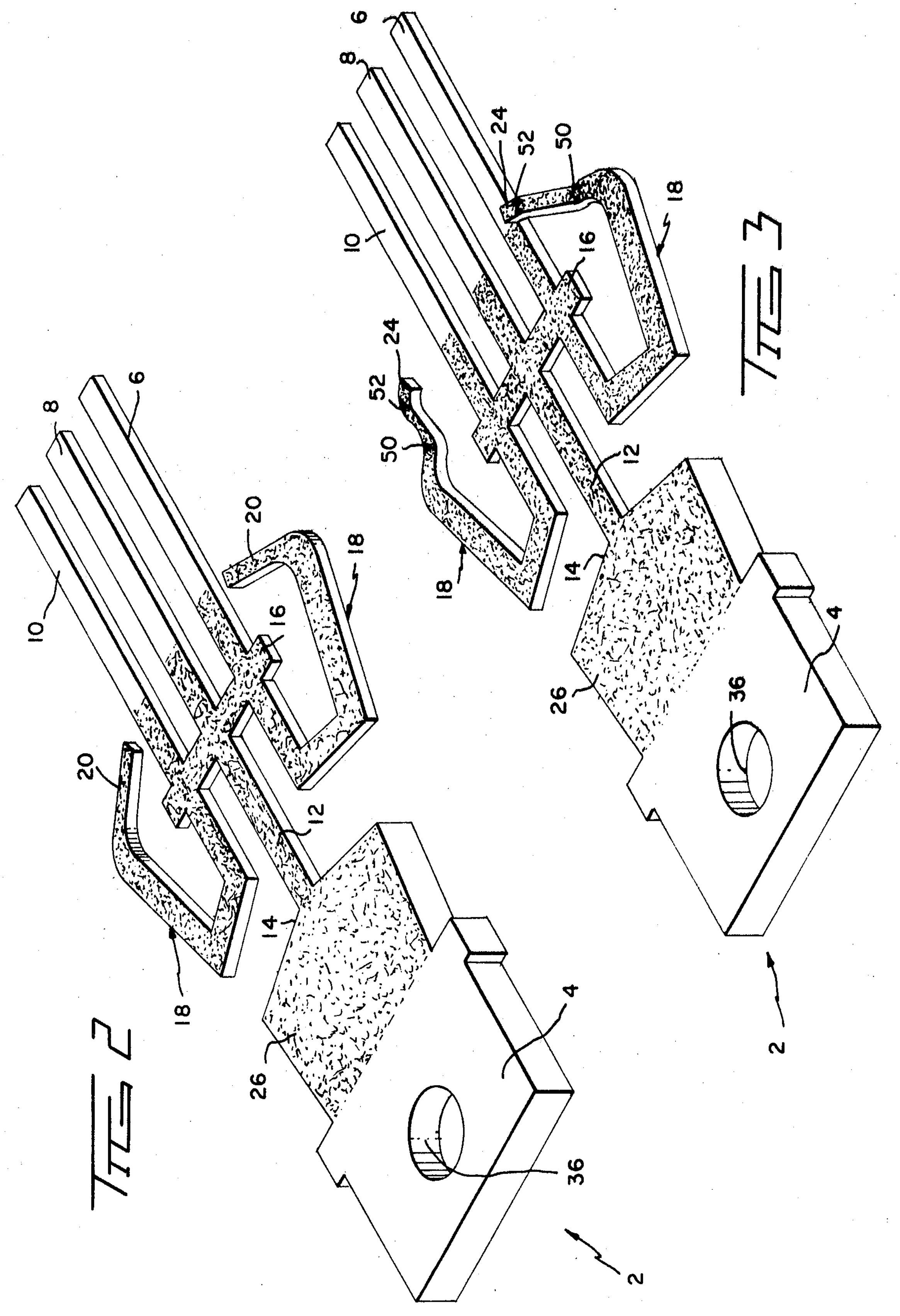
FIG. 2 is a perspective view of the portion of the strip of FIG. 1 after stamping and prior to bending.
FIG. 3 is a perspective view of the portion of the strip of FIG. 1 after the first two bending operations thereon.

As the stock metal passes through a die, pilot hole 36 is first punched and the lead structure is formed in the thin stock section in partial overlapping relationship to the edge of the solder stripe 26, including the leads 6, 8 and 10 as shown in FIG. 2. The strip stock is then blanked to form the leads 6, 8, 10 with the leads 6 and 10 having reversely facing U-shaped portions on their inner ends, the one leg of each U-shaped portion being directed towards the axis of the blank.

Figures 4, 5:
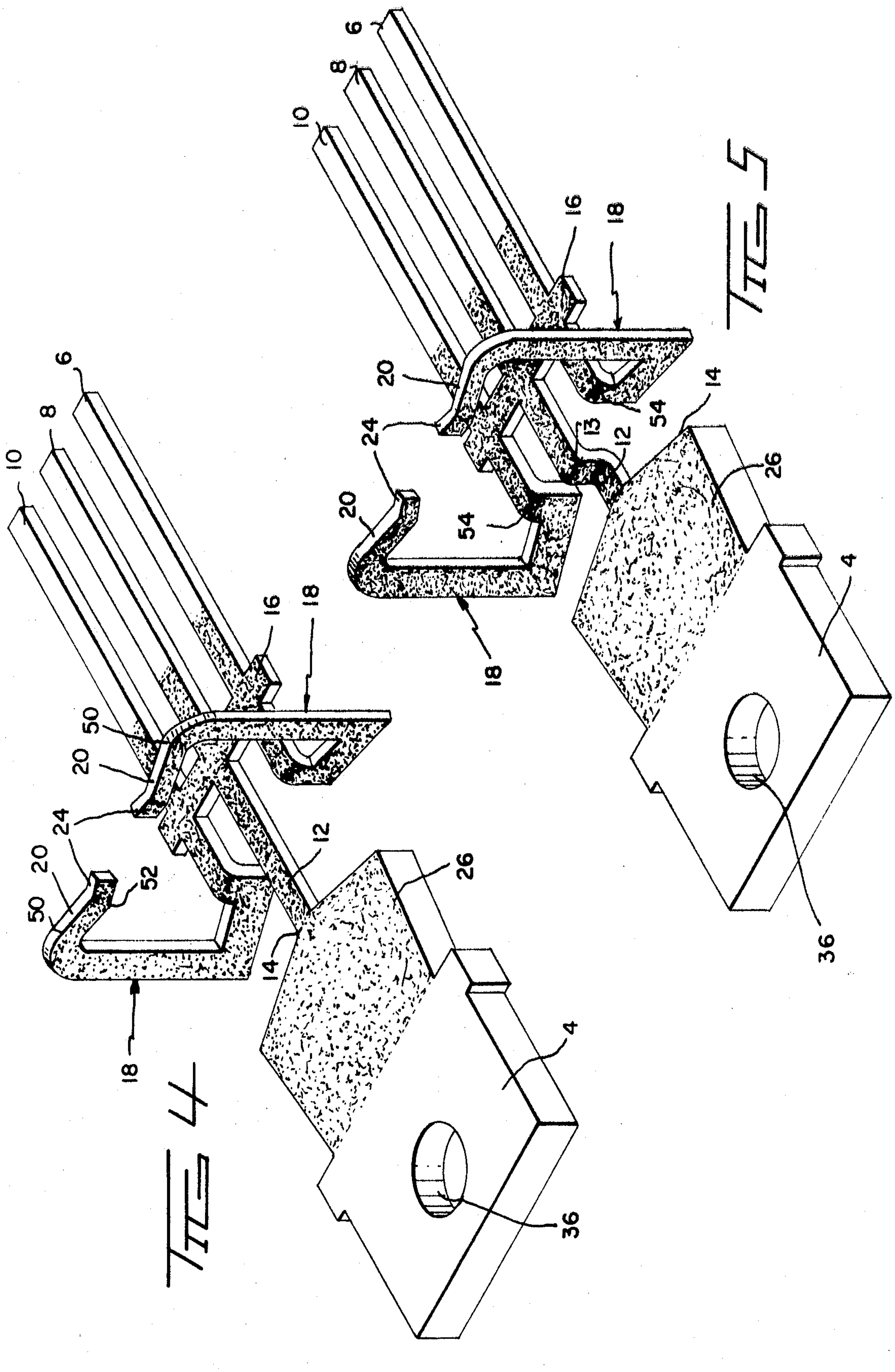
FIG. 4 is a perspective view of the portion of the strip of FIG. 1 after the third bending operation thereon.
FIG. 5 is a perspectivew view of the portion of the strip of FIG. 1 after the fourth and fifth bending operation thereon.

Subsequently, as best shown in FIG. 3, the contact arms 18 are bent upwardly at bends 50 and downwardly at bends 52, the upward angle at bend 50 being equal to the downward angle at bend 52 whereby the tip portions 24 are parallel to the plane of the heat sink 4. The contact arms 18 are then bent 90° in a downward direction at bends 54 as best shown in FIG. 4. The strap portion is then provided with two 90° bends as shown in FIG. 5 to elevate the plane of the leads 6, 8, 10 above the plane of the upper surface of the heat sink 4. The contact arms 18 are then bent downwardly at bends 60 to provide the final lead frame configuration of FIG. 6.

The order of bends is critical to the extent that subsequent bends are capable of being performed despite the changes in form of the blank.

A lead frame in accordance with the invention thus has a mounting plate or heat sink portion, the upper surface of which defines a first plane. First, second and third leads 8, 6, and 10 respectively have free ends which are spaced from this mounting plate portion and have intermediate portions which extend parallel to each other and towards the mounting plate portion. The leads lie in a second plane which is parallel to and spaced from the first plane, the inner ends of the leads being proximate to the mounting plate portion. The first lead 8 has a transition section which is integral with the mounting plate portion and the inner end of the first lead. The second lead has a transition section which extends obliquely from the inner end of the second lead and away from the first lead; this transition section defining a plane which extends transversely of the briefly identified first and second planes, the upper edge of this transition section lying in the second plane and the lower edge lying in the first plane. A lead contact arm is integral with, and extends from the upper edge of the lead transition section, this arm extending in the second plane obliquely towards the mounting portion. The third lead is generally similar to, and a substantial mirror image of, the second lead although these outside leads 6, 10 are not necessarily precisely symmetrical.

A salient feature of the invention described above is that in the finished lead frames, the surfaces of the heat sinks and the surfaces of the contact arms which are opposed to the heat sinks are covered with solder. When a chip is mounted on an individual frame and passed through a furnace, the chip is thus soldered to the heat sink and to the undersides of the arms. The solder surfaces on the arms and on the heat sink are achieved from the single stripe of solder which is applied to the original stock metal.

It can be seen that a strip of lead frames can be provided in accordance with the method above described which requires a minimum number of simple bends after the stamping operation.

Though the invention has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

What is claimed is:

1. A stamped and formed transistor lead frame comprising:

a mounting plate portion having a mounting surface upon which a transistor is adapted to be mounted, said surface defining a first plane, first, second, and third leads, said leads having free ends which are spaced from said mounting plate portions, said leads having intermediate portions which extend parallel to each other and towards said mounting plate portion, said leads being in a second plane which is parallel to, and spaced from, said first plane, said leads having inner ends which are proximate to said mounting plate portion, said first lead being between said second and third leads, a first lead transition section which is integral with said mounting plate portion and said inner end of said first lead, said first lead transition section extending between said first and second planes, said second and third leads having second and third lead transition sections extending divergently from said inner ends of said second and third leads, contact arms extending convergently from said second and third lead transition sections towards said mounting plate portion, said contact arms having contact arm ends which are spaced apart and adjacent to said mounting surface whereby a transistor can be positioned on said mounting plate portion beneath said contact arm ends and said arm ends can be bonded to said transistor to form electrical connections thereto.

2. A lead frame as set forth in claim 1 including a tie bar extending between said intermediate portions of said leads.

3. A lead frame as set forth in claim 2, said lead frame having been formed from stock metal having a stepped profile, said leads, said transition sections, and said contact arms having been formed from a thin section of said stock, said mounting plate portion having been formed from a relatively thick portion of said stock.

4. A lead frame as set forth in claim 3, said mounting surface having a coating of solder thereon and the surfaces of said contact arms which are opposed to said mounting surface having a coating of solder thereon.

5. A stamped and formed transistor lead frame comprising:

a mounting plate portion having a mounting surface upon which a transistor is adapted to be mounted, said surface defining a first plane, first, second, and third leads, said leads having free ends which are spaced from said mounting plate portions, said leads having intermediate portions which extend parallel to each other and towards said mounting plate portion, said leads being in a second plane which is parallel to, and spaced from, said first plane, said leads having inner ends which are proximate to said mounting plate portion, said first lead being between said second and third leads, a first lead transition section which is integral with said mounting plate portion and said inner end of said first lead, said first lead transition section extending between said first and second planes, a second lead transition section extending obliquely from said inner end of said second lead away from said first lead, said second lead transition section defining a plane which extends transversely of said first and second planes and having an upper edge which lies substantially in said second plane and a lower edge which lies substantially in said first plane, a second lead contact arm extending from, and integral with, said upper edge of said second lead transition section, said second lead contact arm extending in said second plane obliquely towards said mounting portion and downwardly towards said mounting portion, said third lead being generally similar to, and a substantial mirror image of, said second lead, said second lead contact arm and the contact arm of said third lead having contact arm ends which are spaced apart adjacent to said mounting portion whereby, a transistor can be positioned on said mounting plate portion beneath said contact arm ends soldered to said contact arm ends and said mounting portion.

* * * * *